United States Patent
Dohse

(10) Patent No.: US 7,847,938 B2
(45) Date of Patent: Dec. 7, 2010

(54) ALIGNMENT SYSTEM FOR OPTICAL LITHOGRAPHY

(75) Inventor: Hans Dohse, Sunnyvale, CA (US)

(73) Assignee: Maskless Lithography, Inc., San Jose, CA (US)

( * ) Notice: Subject to any disclaimer, the term of this patent is extended or adjusted under 35 U.S.C. 154(b) by 247 days.

(21) Appl. No.: 12/240,781

(22) Filed: Sep. 29, 2008

(65) Prior Publication Data

US 2009/0086207 A1   Apr. 2, 2009

Related U.S. Application Data

(60) Provisional application No. 60/997,280, filed on Oct. 1, 2007.

(51) Int. Cl.
*G01B 11/00* (2006.01)
(52) U.S. Cl. .................. 356/400; 356/399; 356/401
(58) Field of Classification Search .......... 356/399–401
See application file for complete search history.

(56) References Cited

U.S. PATENT DOCUMENTS

| | | | |
|---|---|---|---|
| 4,261,107 A | 4/1981 | Coleman et al. | |
| 4,798,470 A | 1/1989 | Moriyama et al. | |
| 4,952,060 A | 8/1990 | Ina et al. | |
| 5,015,555 A | 5/1991 | Lazaar | |
| 5,124,927 A | 6/1992 | Hopewell et al. | |
| 5,285,397 A | 2/1994 | Heier et al. | |
| 5,407,783 A | 4/1995 | Caruso | |
| 5,874,190 A | 2/1999 | Tanaka | |
| 6,037,791 A * | 3/2000 | Yap et al. ..................... | 324/758 |
| 6,525,805 B2 | 2/2003 | Heinle | |
| 6,563,586 B1 * | 5/2003 | Stanke et al. ................ | 356/445 |
| 6,701,197 B2 | 3/2004 | Ben-Ezra et al. | |
| 6,819,789 B1 | 11/2004 | Kantor et al. | |
| 6,861,186 B1 | 3/2005 | Pagette et al. | |
| 6,875,992 B2 | 4/2005 | Castenmiller et al. | |
| 6,894,261 B2 | 5/2005 | Castenmiller et al. | |
| 6,924,883 B2 | 8/2005 | Ozaki et al. | |
| 6,936,385 B2 | 8/2005 | Lof et al. | |
| 7,058,474 B2 | 6/2006 | Ganot et al. | |
| 7,062,354 B2 | 6/2006 | Ganot et al. | |

(Continued)

OTHER PUBLICATIONS

B.F. Conaghan,, Ph.D., "Printed Circuits Handbook", C.F. Coombs, Jr., ed., 5th ed., (McGravel-Hill, 2001), Chapter 26, 30 pages.

*Primary Examiner*—Tarifur R. Chowdhury
*Assistant Examiner*—Isiaka O Akanbi
(74) *Attorney, Agent, or Firm*—Schneck & Schneck; Thomas Schneck

(57) ABSTRACT

An alignment system for optical lithography uses cameras fixed to a movable stage and to a lithography unit to view unique microscopic non-uniformities that are inherent to the surface of a work piece, e.g., metal or ceramic microcrystalline grains, for position referencing. Stage cameras image two sites on the work piece through windows in the stage to establish original position templates. After the work piece has been repositioned, e.g., reversed topside-down, the same two sites are again viewed and template matching establishes the transformed coordinates of the work piece, e.g. by a lithography unit camera under which the stage moves to approximate site locations. Two corner cameras can serve as a coarse positioning mechanism. The alignment system is particular useful for backside alignment in printed circuit board lithography.

8 Claims, 6 Drawing Sheets

U.S. PATENT DOCUMENTS

| | | |
|---|---|---|
| 7,167,296 B2 | 1/2007 | Meisburger |
| 7,295,362 B2 | 11/2007 | Meisburger |
| 2002/0055789 A1 | 5/2002 | Ben-Ezra et al. |
| 2003/0064307 A1 | 4/2003 | Nakamura et al. |
| 2003/0103277 A1* | 6/2003 | Mohwinkel ............... 359/811 |
| 2003/0190071 A1 | 10/2003 | Ganot et al. |
| 2005/0213064 A1 | 9/2005 | Katayama et al. |
| 2005/0213806 A1 | 9/2005 | Hanina et al. |
| 2005/0225788 A1 | 10/2005 | Katayama et al. |
| 2006/0091330 A1 | 5/2006 | Van Bilsen et al. |
| 2006/0092199 A1* | 5/2006 | White et al. ............... 347/9 |
| 2006/0170934 A1 | 8/2006 | Picciotto et al. |
| 2007/0035709 A1 | 2/2007 | Kuit et al. |
| 2007/0046940 A1 | 3/2007 | Gao et al. |

* cited by examiner

ALIGNMENT SYSTEM FOR OPTICAL LITHOGRAPHY

CROSS-REFERENCE TO RELATED APPLICATION

This application claims priority under 35 U.S.C. 119(e) from U.S. provisional application No. 60/997,280, filed Oct. 1, 2007.

TECHNICAL FIELD

The present invention relates to systems and methods for determining the position of a work piece, such as a printed circuit board, for lithography, and relates especially to reestablishing position coordinates of a reversed or repositioned work piece to obtain precise alignment of lithographic features in successive exposures, such as on opposite sides of the work piece.

BACKGROUND ART

For printed circuit boards, it is necessary to print aligned circuit patterns on both sides of an inner core. The inner cores are composed of surface layers of a conductive material, such as copper, on both sides of a dielectric substrate, with the conductive surface layers being selectively removed according to patterns established by lithography to form circuit features. These inner cores will eventually get laminated together to form the final printed circuit board. When a lithography unit exposes each side of the inner core separately, it is important to have a lateral alignment scheme to match position coordinates on both sides so that the front and back patterns will be properly aligned to each other.

The usual alignment method first creates special alignment marks, such as drill holes or patterned features, on one or both sides of the core to establish position references. At least two such marks are needed to account for both lateral x-y displacements in the plane of the surface and rotational skew about any axial point in the plane of the surface. Cameras or physical sensors locate such special marks to determine the position of the work piece.

One example of such an alignment system is found in U.S. Pat. No. 6,701,197 (Ben-Ezra et al.), which writes an alignment pattern on one side of a printed circuit board, while a first lithographic image is written on the other side of the board. The alignment pattern is viewed when the board is flipped over. A second lithographic image is then written on the same side as the alignment pattern. Knowledge of the alignment pattern location defines the position of the already written first image that is now on the underside, so the second image aligns with the first. Other examples of backside alignment systems for lithography that use alignment marks formed on the substrate are found in U.S. Pat. Nos. 6,525,805 (Heinle), 6,861,186 (Pagette et al.), and 6,936,385 (Lof et al.).

It is desirable in many cases to avoid creating any holes in the substrate, so this is a less than adequate alignment solution. Formation of special alignment marks on the substrate is better, but also is not always desired. Additionally, both techniques have accuracy issues. The accuracy of alignment marks is limited by the size of the marks themselves, and finer control of alignment is sought.

SUMMARY DISCLOSURE

Better alignment accuracy is achieved without having to form any holes or special alignment marks by a method of aligning a work piece that uses unique inherent microscopic characteristics of the work piece surface, such as the grain structure of metals or ceramics, as a position reference. Two widely spaced apart surface sites are chosen for microscopic examination by cameras fixed to a movable stage onto which the work piece is placed, and also by a camera fixed to the lithography unit. Pattern matching of the two site images first obtained by the stage cameras with images of the same sites obtained by the lithography unit camera when the work piece is reversed (or otherwise repositioned) allows the relative positions of the work piece to be accurately computed and thus the successive printed lithography features, such as front and backside features, to be aligned. Image pixels corresponding to surface areas on the order of just 1-micron square or smaller allow a corresponding positioning accuracy to be achieved.

An exemplary alignment system of the present invention may comprise first and second stage cameras that are fixed to a movable stage on which the work piece is positioned and that view respective first and second sites of the work piece surface through windows in the stage. Another camera that is fixed to the lithography unit is used, as needed, to view the same sites from above whenever the work piece is reversed. Some coarse locating mechanism, such as other cameras fixed to the stage and lithography unit, may be provided to enable approximate location of the sites when the work piece is reversed or otherwise repositioned. A computer is adapted to perform a pattern match of the first set of microscopic grain images obtained by the stage cameras from the first and second sites on the work piece surface with a second set of microscopic grain images obtained from the same sites after the work piece has been reversed or repositioned, thereby computing relative position coordinates. The computer then controls fine movement of the stage under the lithography unit based on the computed position coordinates for the work piece. All of the cameras involved in the alignment have accurately known positions relative to the stage or lithography unit through an initial calibration routine.

An alignment method in accord with the invention thus comprises placing a work piece onto the movable stage, viewing and storing microscopic grain images from the first and second surface sites on a first side of the work piece using the stage cameras, and exposing a second side of the work piece to a lithographic writing process by the lithography unit. Then, after the work piece has been repositioned on the stage, again viewing and storing microscopic grain images at approximate locations of the first and second sites on the first side of the work piece (moving the stage and using the lithography camera in the case where the work piece has been reversed), performing a pattern match of the respective sets of images in order to compute a relative position and rotation of the repositioned work piece, and again exposing the work piece to a lithographic writing process by the lithography unit, using the computed position to achieve alignment of the first and second lithographic exposures.

DETAILED DESCRIPTION

The invention relates predominantly to two-sided optical lithography for printing patterns successively on both sides of a printed circuit board. More generally, the work piece may be any substrate where aligned patterning may be required, including printed circuit boards, ceramic hybrid circuit substrates, semiconductor substrates, semiconductor packages, flat panel displays, etc. Additionally, while front-to-back alignment of lithographic features on reversible substrates is the chief motivation, the invention can also be applied to any lithographic method where position coordinates of a work piece must be reestablished for properly aligning successive exposures; as when the work piece is removed after a first exposure for cleaning or other processing, then repositioned under the lithography unit for another exposure, possibly with a different mask.

Figure 1:
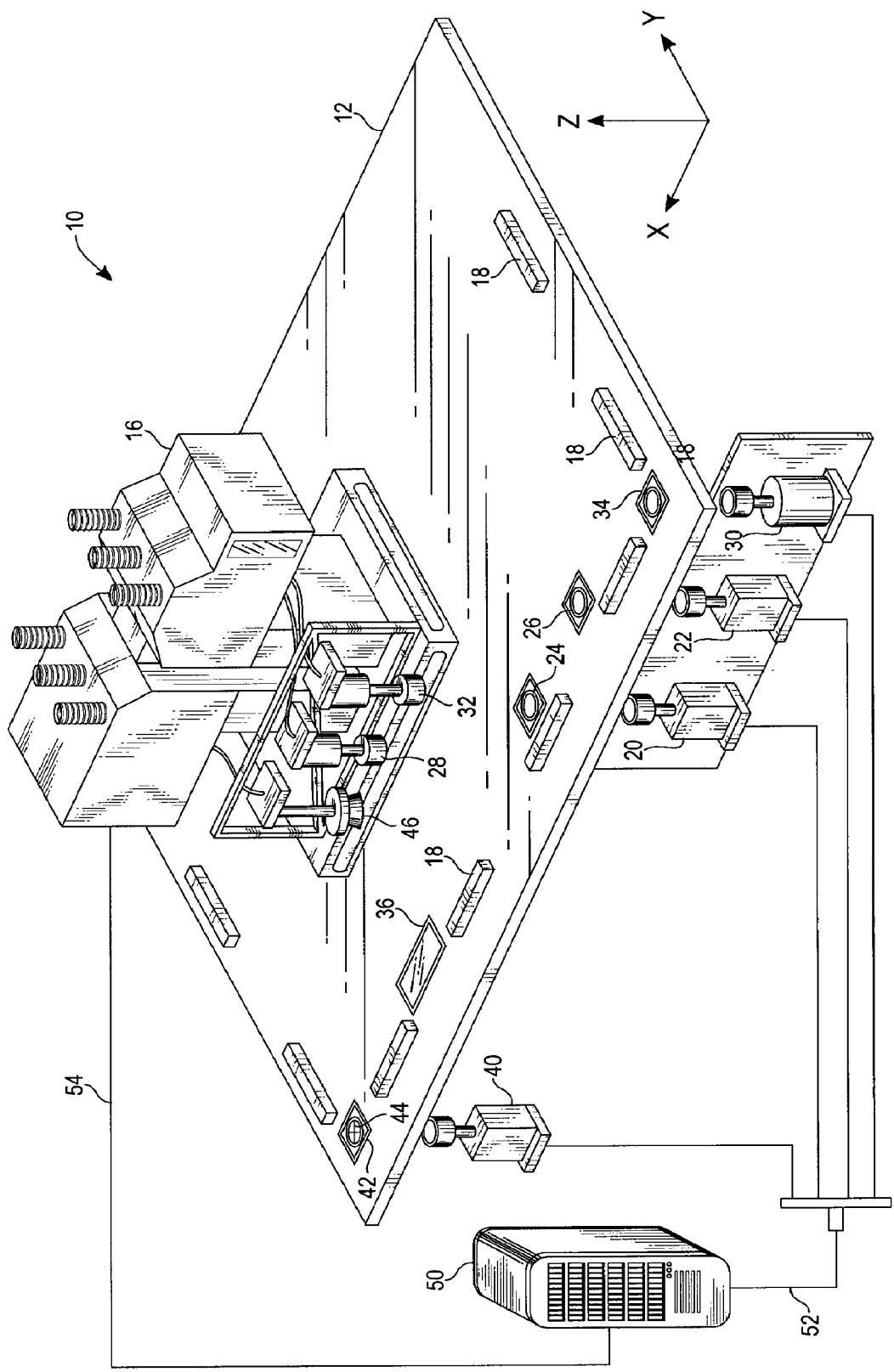
FIG. 1 is a perspective view of a lithography apparatus with movable stage, lithography unit, and the alignment system in accord with the present invention.
Figure 2:
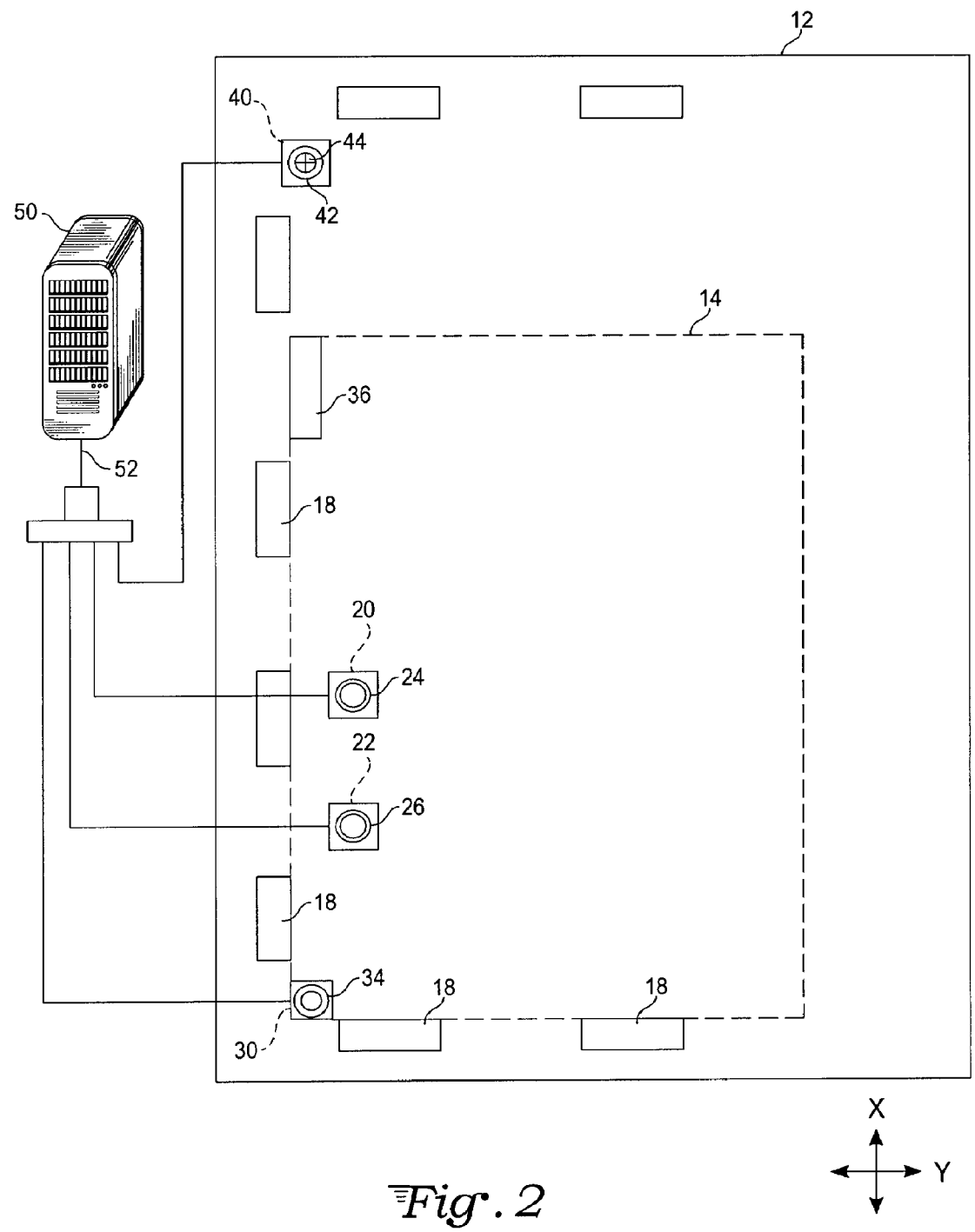
FIG. 2 is a top view of the movable stage in FIG. 1, showing windows for underlying stage cameras of the alignment system in accord with the invention. Dashed perimeter lines outline the potential position of a work piece to be placed on the stage.
Figure 3:
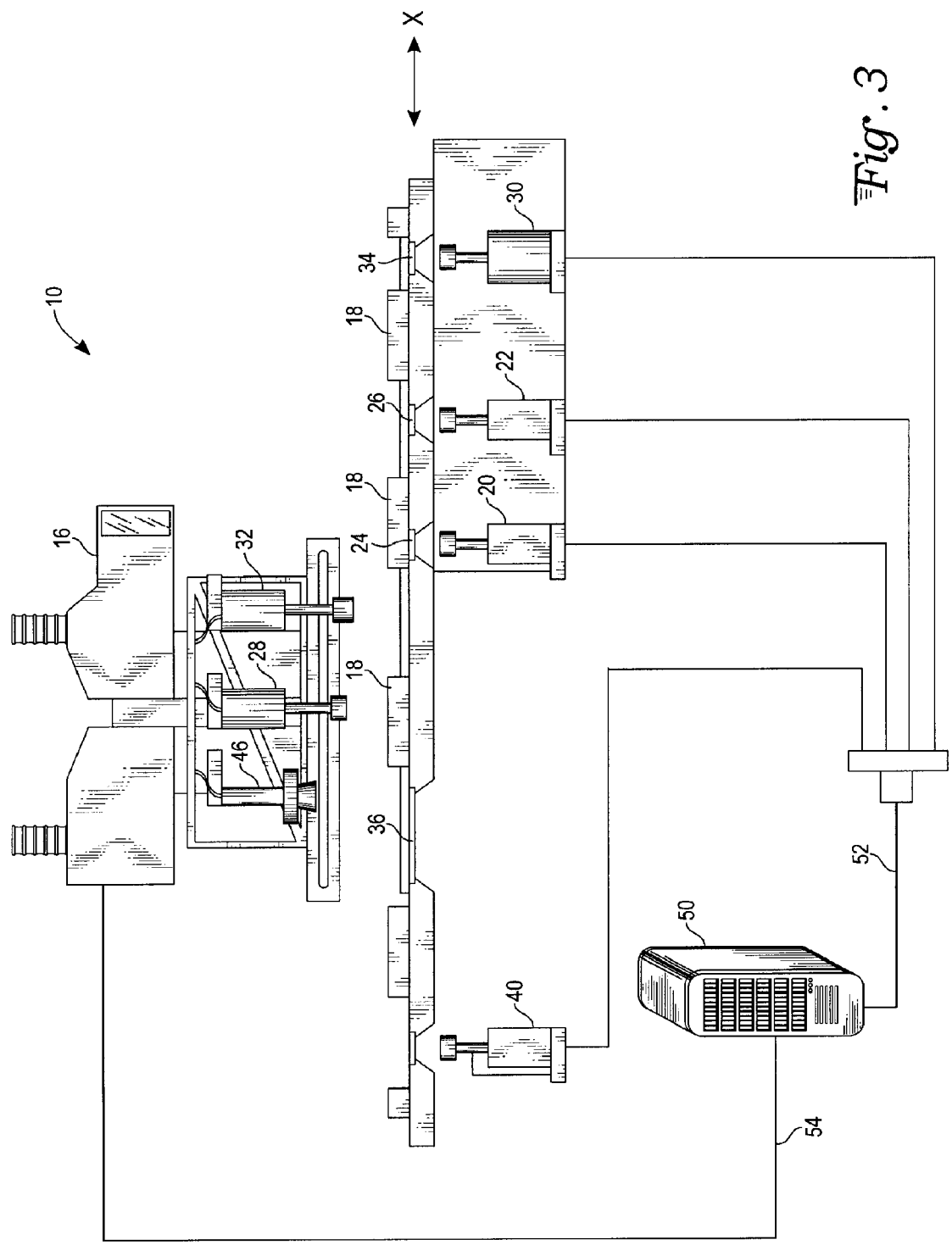
FIG. 3 is a side view of the lithography apparatus of FIG. 1.

With reference to FIGS. 1 to 3, a lithography apparatus 10 generally includes a movable stage, table or chuck 12 onto which a work piece 14 may be placed, such as an inner core of a printed circuit board. A lithography unit 16 is situated above the stage so as to expose the work piece to a lithographic writing process. The stage 12 is typically movable at least two dimensions, such as in either direction along the orthogonal axes X and Y. There may also be a vertical Z component of motion for achieving desired scale of the exposure. The movable stage may include a number of mechanical stops 18 to limit the placement of the work piece 14 at one or more of its edges. The lithography unit 16 may be fixed in place in the overall apparatus 10, while the stage 12 and work piece 14 move under it, or the unit 16 may itself be movable in one or more X, Y or Z directions. One such lithography apparatus 10 to which the alignment system of the present invention may be applied is described in further detail in U.S. Pat. Nos. 7,167,296 and 7,295,362 assigned to the assignee of the present invention and incorporated by reference herein. It uses direct writing by light projection using a spatial light modulator that contains an array of individually switchable elements to regulate the dose of optical energy received by the photosensitive substrate at each pixel location. Other lithography apparatus could also be used.

The optical alignment system includes a pair of upward-looking cameras 20 and 22 that are fixed to a movable stage 12 on which the work piece 14 is positioned and that view respective first and second sites of the work piece surface through respective first and second windows 24 and 26 in the stage 12. That is, the first-site stage camera 20 looks up through window 24 at a first site on the work piece 14, and the second-site stage camera 22 looks up through window 26 at a second site on the work piece 14. The windows 24 and 26 protect the cameras 20 and 22 underneath from dirt. The two sites which are defined by the camera locations are to be widely spaced apart for best alignment resolution, but are otherwise arbitrary and the exact locations on the work piece 14 are determined within those constraints by the particular manner in which the work piece 14 is first placed on the stage 12. The optical alignment system likewise includes a downward-looking lithography unit camera 28 fixed to the lithography unit 16 to view the same first and second sites when the work piece is reversed (bottom side up). In that case, the stage 12 moves laterally in two dimensions X and Y under the lithography unit 16 and its camera 28 until the sites are approximately located.

All three of these site-viewing cameras 20, 22 and 28 image non-uniform microscopic characteristics that are inherent to the work piece surface and unique to each location, such as the grain structure of metals or ceramics. For example, printed circuit board cores typically have conductive surfaces made of copper, but other metals might also be used. The graininess of the copper or other metal provides excellent unique features for use in lateral alignment. Ceramic or composite surfaces subject to lithographic patterning, such as for ceramic hybrid circuit substrates and semiconductor packages, also have a discernible inherent microscopic grain structure. Other polycrystalline materials, such as in semiconductors used in some arrays of photovoltaic cells and the like, also have inherent grain structures that could be exploited for lithographic alignment.

The system requires images of the surface with sufficient magnification that the grain in the material is visible. Because of the randomness of the position, size and orientation of the grains, each location produces images that are unique enough to serve as a precise position reference. A first set of microscopic grain images are obtained by the stage cameras 20 and 22 from the first and second sites on the work piece surface. To further improve lateral registration of positions, sub-images that contain the most unique grain patterns are extracted from the overall images acquired by the cameras 20 and 22 to be stored as image templates for pattern matching. For example, the camera image area may be 160 by 160 pixels, 240 by 240 pixels or larger, while the selected template sub-images may be 80 by 80 pixels or smaller, where each image pixel represents an area on the work piece surface on the order of 1 micron-square.

In the case where the work piece 14 is to be removed and subsequently repositioned back onto the stage without reversing, the template sub-images should chosen to be near the center of the images first acquired by the stage cameras 20 and 22 in order to ensure that these same sub-images are again viewable through the windows 24 and 26 by the stage cameras 20 and 22 when the work piece is repositioned. In the case where the work piece is to be reversed, this constraint on selecting the sub-images does not apply, since the lithography unit camera 28 is able to view any portion of the work piece that faces it, including any portion of the original first and second sites and neighboring areas, simply by moving the stage 12 under the camera 28 to the approximate locations of those original sites. Thus, the stored sub-images selected as the positioning templates are readily found again after reversal of the work piece 14. In either case, a second set of microscopic grain images are obtained from the same sites after the work piece has been reversed or otherwise repositioned and the corresponding sub-images are identified by template matching using a known cross-correlation algorithm or similar technique.

Figure 4:
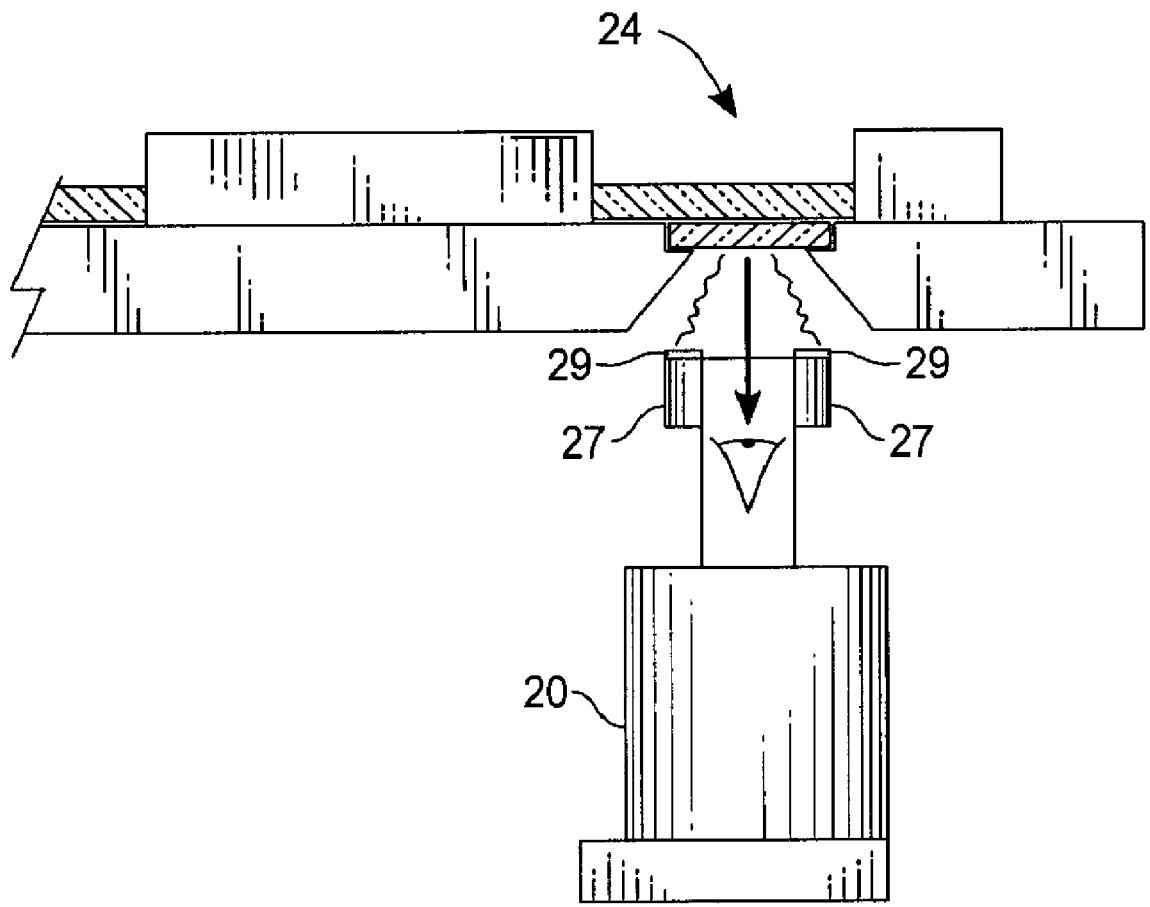
FIG. 4 is an enlarged sectional view of the movable stage with a window and underlying stage camera.

For lithography, the surface of the work piece 14 being positioned under the lithography unit 16 is normally covered with photo-resist to be selectively exposed with some pattern. A surface covered with photo-resist is most effectively imaged in a dark field mode. This avoids light being reflected from the photo-resist surface into the image and obscuring the pattern to be sought. Dark field imaging also avoids specular reflection from the windows 24 and 26 into the stage cameras 20 and 22. As represented in FIG. 4 for camera 20, a suitable light source for this imaging mode is an annular arrangement of light emitting diodes (LEDs) 27 around the optic axis of each camera 20, 22, and 28, with a diffuser 29 in front of the LEDs 27 to ensure a truly annular illumination (and not a collection of point sources). The photo-resist should be substantially insensitive to the camera illumination. Red light has been found to be effective. Typically, the windows will have an area of about 30 mm square and a thickness of about 2 mm. Sapphire or glass windows can be used. The underside of the stage should be beveled at the window perimeters to allow light that is directed inwardly at angle from the ring of LEDs 27 to be incident upon the window and overlying work piece 14.

Since the sites viewed by the cameras 20, 22, and 28 are not more than a few hundred microns wide and the target template areas are even smaller, some coarse locating mechanism is provided to facilitate locating the sites after the work piece is repositioned. For example, two corner cameras 30 and 32 fixed respectively to the stage 12 and lithography unit 16 may be provided to view two corners of the work piece 14, one from below and one from above. Cutouts or windows 34 and 36 are made in the stage 12 over the corner areas to provide visible contrast. Bright field or dark field images may be used. Camera images of the work piece corners might typically be 640 by 480 pixels, where the pixel size is on the order of 10 microns square.

For example, an upward-looking corner stage camera 30 mounted on the stage 12 acquires the image of a first corner of the work piece 14. Camera 30 looks at this first corner in dark field illumination through a first corner window 34 in the stage 12 that protects camera 30 from dirt. A downward-looking camera 32 mounted in fixed relation to the lithography unit 16 acquires the image of a second corner of the work piece 14. Corner camera 32 looks at this second corner with dark field illumination. Behind the second corner there is a cutout 36 so that the contrast will be very similar to that of corner images acquired from below. The cutout 36 may be elongated to accommodate a variety of work piece lengths. When the work piece 14 is reversed, the first corner will overlay the cutout 36 that the second corner formerly occupied. The work piece 14 will also be pushed against the mechanical stops 18 so that the second corner will be sure to overlay the window 34 formerly occupied by the first corner.

From the acquired corner images of the work piece 14, the coarse locations of the two corners are calculated. When the work piece 14 is reversed, the coarse locations of the two corners are recalculated. Any known edge recognition algorithm may be used for this purpose. From the relative locations of the corners, a coarse coordinate system (translation and rotation) for the repositioned work piece can be computed to estimate the approximate locations of the first and second sites.

To determine the positions of the cameras themselves, the alignment further includes a calibration camera 40 fixed to the movable stage 12 under a calibration window 42 in the stage 12. The calibration window 42 has a fiducial mark 44 that serves as an absolute position reference for the stage 12. The calibration camera 40 views the fiducial mark 44 and each of the lithography unit cameras 28 and 32. A calibration laser 46 is fixed to the lithography unit 16 and is operative to produce a downward-directed laser beam that provides a light spot to be viewed in turn by cameras 40, 20, 22, and 30. The position of the calibration camera 40 is determined relative to the fiducial mark 44 using a known cross-finding algorithm applied to the calibration camera's image of the mark 44. The laser spot directed onto the calibration window 42, as viewed by the calibration camera 40, fixes the position of the laser 40 relative to the fiducial mark 44. From these two established positions of the calibration camera 40 and the calibration laser 46, the other camera positions are fixed by applying the laser light spot to be viewed by the stage cameras 20, 22, and 30, and by viewing the lithography unit cameras 28 and 32 relative to the fiducial mark 44 by the calibration camera 40. Thus, the calibration camera 40 using the fiducial mark 44 locates the downward-looking cameras 28 and 32 on the lithography unit 16 and locates the calibration laser 46, while the calibration laser 46 using its beam spot locates the upward-looking site and corner stage cameras 20, 22, and 30.

A computer system 50 is provided with the lithography apparatus 10, not only to control movement of the movable stage 12 and lithographic writing by the lithography unit 16, but also to perform the various alignment computations. A cable 52 supplies image data from the stage cameras 20, 22, 30, and 40. Likewise, a cable 54 supplies image data from the lithography unit cameras 28 and 32. The alignment computations performed by the computer system 50 include the initial position calibration of the cameras, edge recognition for the corner images, template selection from the original first-site and second-site images by the stage cameras 20 and 22, coarse computation of the approximate site locations based on comparison of the corner images after repositioning with the originals using a known coordinate transformation algorithm, template matching by cross-correlation of the second set of first-site and second-site images with the selected template, and fine computation of the repositioned coordinates (displacement and skew), again with a known coordinate transformation algorithm. These alignment computations are built from known algorithms, such as those provided in a standard library of commercial mathematics software, such as MathLab.

Figure 5:
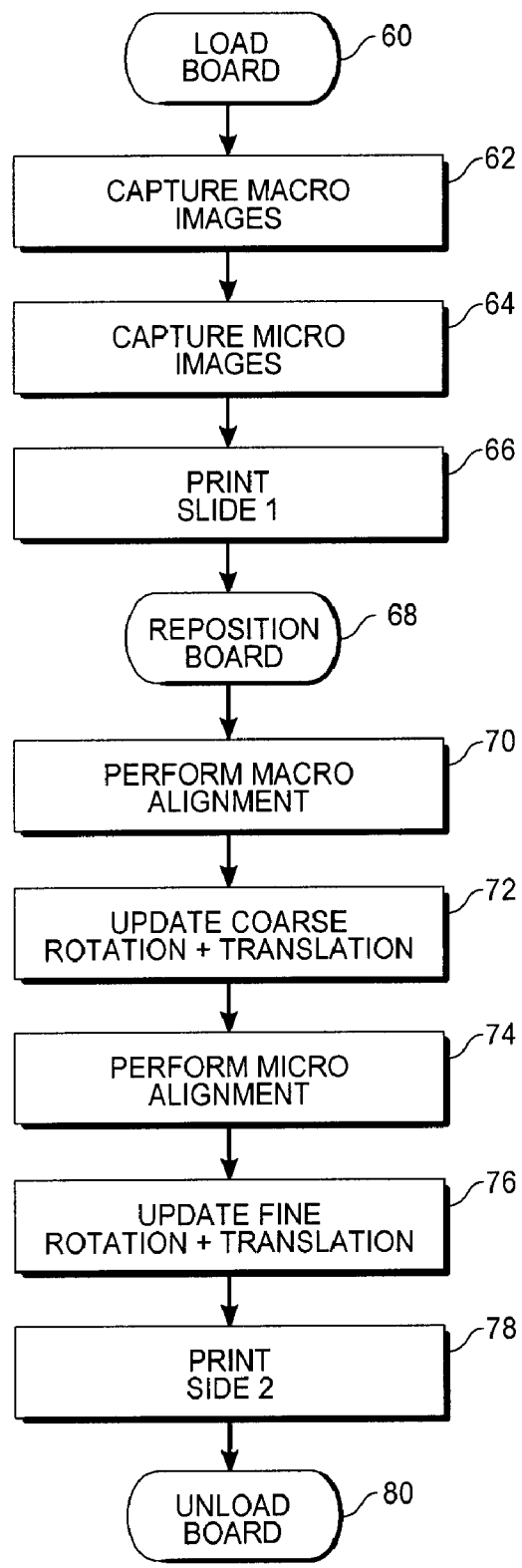
FIG. 5 is a flow diagram of a lithographic process embodiment containing an alignment method in accord with the present invention.

With reference to FIG. 5, a process flow for lithographic patterning of a work piece, such as a printed circuit board core, and that includes accurate aligning of the work piece for exposure by a lithography unit, particularly after repositioning or reversal, begins by first loading 60 the printed circuit board or other work piece in an obverse position (first side down) onto the movable stage of the lithography apparatus.

Figure 6:
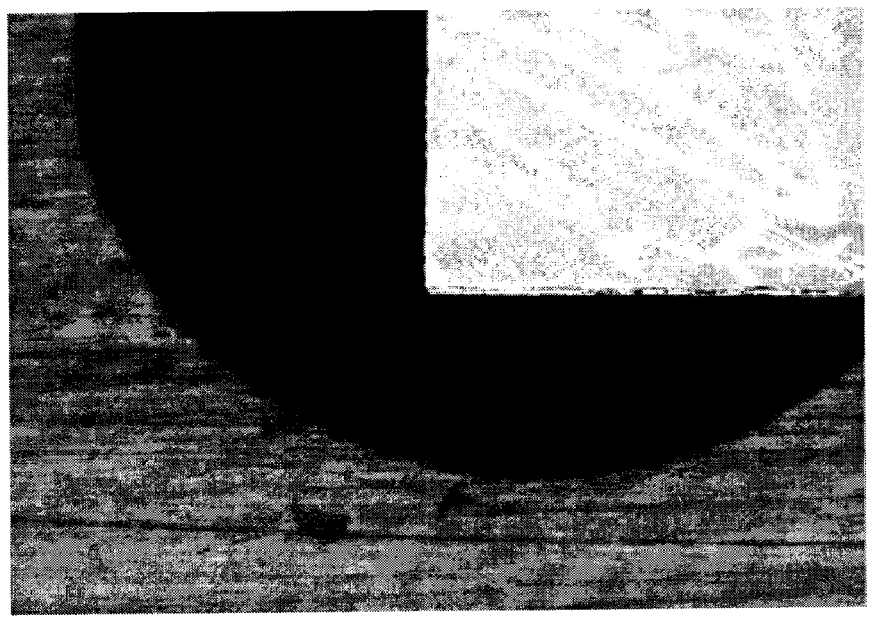
FIG. 6 is an exemplary corner image.

Macro images of work piece corners are viewed and captured 62 by the corner cameras and stored in the computer system. The stage will need to be moved so that the lithography unit's corner camera is situated above a corner, thereby also establishing an estimated width of the work piece. From these images, original coarse positions of the corners can be calculated using a known edge recognition algorithm. FIG. 6 shows an exemplary corner macro image for coarse positioning.

Figure 7:
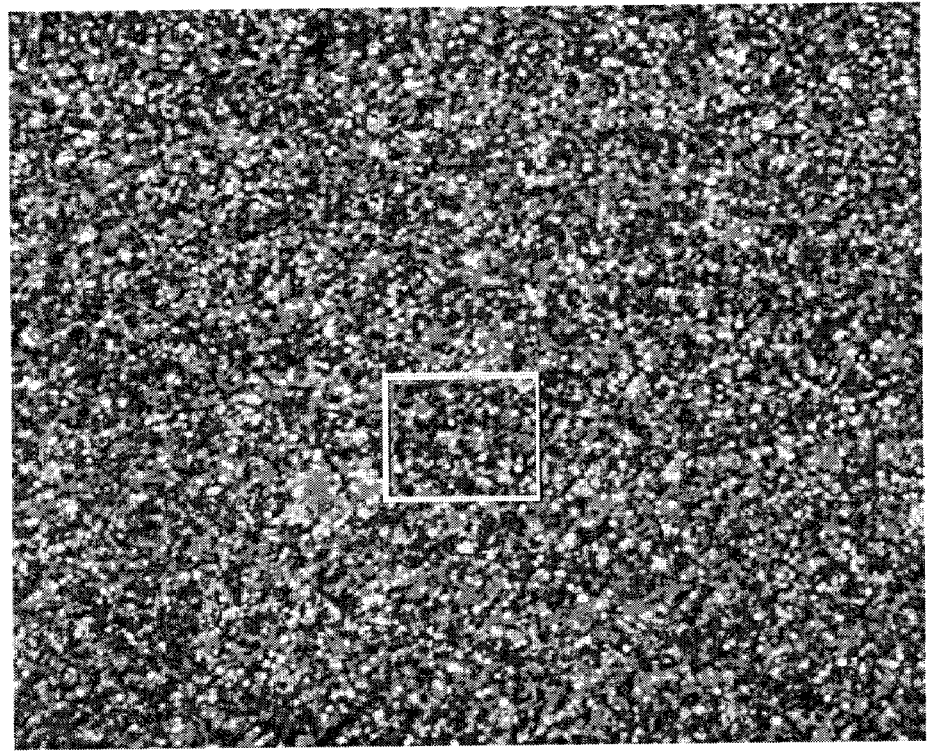
FIG. 7 is an exemplary site image with overlay of matching template.

Micro images of selected first and second sites of the work piece are viewed and captured 64 through stage windows by the stage site cameras and stored in the computer system. From these site images, sub-image templates can be selected by the computer system for later template matching after the work piece has been reversed or otherwise repositioned. FIG. 7 shows an exemplary site image with an overlay indicating a selected template to be matched. The approximate locations of the first and second sites are known from the relation of the stage site cameras to the calculated corner positions.

Once these corner and site reference images have been captured and stored, the second (face up) side of the work piece is exposed to a lithographic writing process 66 by the lithography unit. Depending on the work piece and the particular lithographic process, the work piece might undergo some intermediate processing (development, etching, cleaning, etc.) at this point. In any case, the work piece is removed from the stage and subsequently repositioned 68 back onto the stage. In the case of printed circuit board lithography, the board is typically immediately reversed (the bottom first side up and the top second side down) on the movable stage without any intermediate processing. In all cases, the repositioned or reversed work piece is no longer in exactly the same position on the stage as it was originally, and for alignment purposes the position coordinates relative to the original position need to be computed.

Macro images of work piece corners are again viewed and captured 70 by the corner cameras and stored in the computer system. The stage will again need to be moved so that the lithography unit's corner camera is situated above a corner; in particular, so that the same corners are recaptured. In the case of work piece reversal, the first and second corners have switched places, so that the opposite camera from the original does the capturing. From these images, new coarse positions of the corners are calculated 72, again using a known edge recognition algorithm. A coarse coordinate transformation maps the first coordinate system based on the original corner locations to an updated coordinate system based on the new corner locations. This coarse mapping establishes the approximate new locations of the original first and second sites, taking into account the mirroring of the position coordinates caused by reversal of the work piece, as well as the displacement and rotation that have likely occurred due to the repositioning of the work piece onto the stage.

Micro images of the work piece are viewed and captured 74 at the approximate locations of the first and second sites. If the work piece has been reversed, as is typically the case for printed circuit board processing, the lithography unit's site camera is used to view the now upwardly facing first side of the work piece. The stage is moved under the lithography unit so that the respective first and second sites can be successively observed. If the work piece has been simply replaced back in the same original obverse position, then the first and second sites should again be in the view of the stage site cameras through the respective site windows in the stage. The mechanical stops on the stage will ensure that repositioned work piece is nearly in the same position as it was original, while template matching will identify the exact movement caused by the repositioning.

In either case, template matching between the original selected templates for the first and second sites with the new first and second site images will identify the relative image shifts. The template sub-image portion of the new site images need not be, and are usually not, identical to the original sub-images, due to differences in cameras, the presence of the window in one image and not in the image of a reversed work piece, the presence of dust or other artifacts in one but not the other microscopic image, etc. However, known cross-correlation routines score each potentially matching sub-image against the original template, and choose the sub-image with the best score as that constituting a match. Based on the matching sub-images for the two sites, the coordinate positions are further updated 76 using standard coordinate transformations, establishing the fine relationship between the original and repositioned first and second site positions.

The topside of the work piece is exposed to a lithographic writing process 78 by the lithography unit based on the computed relative positions of the repositioned work piece. In the case of reversal of the work piece, the former first bottom side is now being exposed, which should register with the position of the pattern previously formed on the second side. In the case of simple repositioning, a second pattern is formed over the first on the same side of the work piece, and should likewise align. After this second lithographic processing, the work piece can then be unloaded 80.

What is claimed is:

1. An optical alignment system for photolithography, comprising:
    a coarse locating mechanism means for establishing a position of a photolithographic substrate on a movable stage having an optically non-uniform surface;
    first and second cameras aimed from fixed locations towards the non-uniform surface so as to create original images of first and second regions of the substrate;
    pattern recognition means for fine position locating of the substrate based upon movement of the stage; and
    means for moving the stage after repositioning the substrate on the stage until new images of the first and second regions are aligned with the original images using the pattern recognition means, thereby creating a fine position locating mechanism for the repositioned substrate.

2. An alignment system for two-sided lithography, wherein a reversible work piece is positioned on a movable stage for exposure by a lithography unit, the alignment system comprising:
    a first-site stage camera fixed to the movable stage and situated to view a first side of the work piece at a first site through a first window of the stage;
    a second-site stage camera fixed to the movable stage and situated to view the first side of the work piece at a second site through a second window of the stage;
    a lithography unit area camera fixed to the lithography unit and situated to view, when the work piece is reversed, the first side of the work piece at the respective first and second sites by movement of the movable stage; and
    a computer adapted to determine a position of a reversed work piece viewed by the lithography unit area camera relative to the first and second sites viewed by the stage cameras by performing a pattern match of microscopic grain images of the work piece surface obtained by the lithography unit area camera at approximate locations of the first and second sites with microscopic grain images of the work piece surface obtained by the respective first-site and second-site stage cameras.

3. The alignment system as in claim 2, further comprising:
    a corner stage camera fixed to the moveable stage and situated to view a first corner of the work piece through a third window of the stage; and
    a lithography unit corner camera fixed to the lithography unit and situated to view the first corner of the work piece when the work piece is reversed.

4. The alignment system as in claim 2, further comprising:
    a fiducial mark on an alignment window of the stage viewable by the lithography unit cameras;
    a laser source fixed to the lithography unit and operative to provide a laser spot onto the stage cameras; and
    an alignment camera fixed to the stage and situated to view the fiducial mark and the laser spot.

5. The alignment system as in claim 2, wherein the cameras include an annular ring of LEDs around their aperture for dark field illumination of the work piece.

6. A method of optically aligning a substrate for successive exposures by a lithography unit, comprising:
    placing the substrate onto a movable stage;
    establishing an original coarse position of the substrate;
    creating original images with first and second cameras aimed from fixed locations at first and second regions of the substrate;

establishing a new coarse position of the substrate after repositioning the substrate and moving the stage until new images of the first and second regions are obtained; and performing pattern comparison of the original and new images of the first and second regions until a pattern match is recognized, the images recording unique microscopic non-uniformities inherent to the substrate, thereby finely locating the position of the repositioned substrate on the stage.

7. A method of aligning a reversible work piece for exposure by a lithography unit, comprising:

placing the work piece in an obverse position onto a movable stage;

viewing and storing microscopic grain images of first and second sites of a first side of the work piece through respective first and second windows of the stage by respective first-site and second-site stage cameras fixed to the stage;

exposing a second side of the work piece to a lithographic writing process by the lithography unit;

reversing the work piece on the movable stage;

viewing and storing microscopic grain images of at approximate locations of the first and second sites by a lithography unit area camera fixed to the lithography unit;

computing a relative position of the reversed work piece by performing a pattern match of the images obtained by the lithography unit area camera with the images obtained by the respective first-site and second-site stage cameras;

exposing the first side of the work piece to a lithographic writing process by the lithography unit based on the computed relative position of the reversed work piece.

8. The method as in claim 7, further comprising:

viewing and storing an image of a first corner of the work piece when placed on the movable stage in both the obverse and reverse positions; and using the corner images to provide a coarse alignment sufficient to compute approximate locations of the first and second sites for viewing by the lithography unit area camera.

* * * * *